United States Patent
Lo et al.

(10) Patent No.: US 12,463,030 B2
(45) Date of Patent: Nov. 4, 2025

(54) SELECTIVE OXIDATION OF A SUBSTRATE

(71) Applicant: Applied Materials, Inc., Santa Clara, CA (US)

(72) Inventors: Hansel Lo, Santa Clara, CA (US); Chris Olsen, Santa Clara, CA (US)

(73) Assignee: Applied Materials, Inc, Santa Clara, CA (US)

( * ) Notice: Subject to any disclaimer, the term of this patent is extended or adjusted under 35 U.S.C. 154(b) by 525 days.

(21) Appl. No.: 17/956,157

(22) Filed: Sep. 29, 2022

(65) Prior Publication Data

US 2024/0112903 A1 Apr. 4, 2024

(51) Int. Cl.
    *H01L 21/02* (2006.01)
(52) U.S. Cl.
    CPC .. *H01L 21/02236* (2013.01); *H01L 21/02164* (2013.01); *H01L 21/0217* (2013.01); *H01L 21/02247* (2013.01)
(58) Field of Classification Search
    CPC .................................... H10D 64/516
    See application file for complete search history.

(56) References Cited

U.S. PATENT DOCUMENTS

| 9,236,242 B2 | 1/2016 | Ueda |
| 2013/0164919 A1 | 6/2013 | Park et al. |
| 2014/0106574 A1 | 4/2014 | Kang et al. |
| 2017/0194135 A1 | 7/2017 | Nakayama |
| 2018/0090599 A1 | 3/2018 | Bu et al. |
| 2019/0080903 A1 | 3/2019 | Abel et al. |
| 2019/0157322 A1* | 5/2019 | Li .................... H01L 21/763 |
| 2021/0242032 A1 | 8/2021 | Colinjivadi et al. |
| 2022/0102155 A1 | 3/2022 | Chang et al. |

FOREIGN PATENT DOCUMENTS

| TW | 201238001 A | 9/2012 |
| TW | 202035760 A | 10/2020 |

OTHER PUBLICATIONS

International Search Report and Written Opinion for International Application No. PCT/US2023/033738, mailed Jan. 16, 2024, 12 Pages.
Office Action with English translation of Search Report for Taiwan Patent Application No. 112137228 dated Jun. 23, 2025, 7 pages.

* cited by examiner

*Primary Examiner* — John A Bodnar
(74) *Attorney, Agent, or Firm* — Lowenstein Sandler LLP (57) ABSTRACT

Described herein is a method for selectively oxidizing a substrate. The method includes forming a non-conformal layer on at least one side surface of a trench or a hole of a substrate. After forming the non-conformal layer, the at least one trench or at least one hole may be selectively oxidized, wherein oxidation of the non-conformal layer and an exposed portion of the at least one side wall not covered by the non-conformal layer occurs to form an oxide layer. The oxide layer is thicker at a lower portion of the at least one side wall than the upper portion of the at least one side wall, such that it tapers.

16 Claims, 5 Drawing Sheets

SELECTIVE OXIDATION OF A SUBSTRATE

TECHNICAL FIELD

Embodiments of the present disclosure relate, in general, to a method for oxidizing a substrate, wherein the method for oxidizing uses a non-conformal layer to enable selective oxidation between different regions of the substrate.

BACKGROUND

In the semiconductor industry, devices are fabricated by a number of manufacturing processes producing structures of an ever-decreasing size. Some of these devices include high aspect ratio structures which include a plurality of holes or trenches in the device.

To manufacture some devices an oxidation step is performed. However, it has been found that when oxidizing a high aspect ratio structure, the oxide layer forms primarily at the upper portion of the structure, and a thickness of an oxide layer is thinner deeper into the structure. This is believed to occur because when the oxidizing agent is applied to the structure, it interacts with the upper portion of the high aspect ratio structure first, depleting the chemistry that causes the oxidation. As the oxidizing agent interacts with the upper area, the oxidizing agent is consumed and an oxide layer begins to form at the upper area, which prevents or inhibits the oxidizing agent from moving down to the lower portion of the high aspect ratio structure. Thus, this causes a non-conformal oxide layer to form, where the top or upper portion of the high aspect ratio feature has a thicker oxide layer than the bottom or lower portion of the high aspect ratio feature, which may have a thinner or even no oxide layer.

SUMMARY

In some embodiments of the present disclosure, a method of oxidizing a substrate is provided. The method may include forming a non-conformal layer on at least one side wall of a trench formed on a substrate, wherein the non-conformal layer forms on an upper portion of the at least one side wall and decreases in thickness with increased depth into the trench. The non-conformal layer may include nitrogen or carbon. In some embodiments, the method may include selectively oxidizing at least one trench including the non-conformal layer. The oxidation of the non-conformal layer and an exposed portion of the at least one side wall not covered by the non-conformal layer occurs to form an oxide layer. The oxide layer may be thicker at a lower portion of the at least one side wall than the upper portion of the at least one side wall.

In another embodiment of the present disclosure, an article including a substrate is provided. The substrate may include at least one trench formed therein, the at least one trench having a top surface, a bottom surface and at least one side wall. The article may also include an oxide layer on the at least one side wall of the at least one trench, wherein the oxide layer is thicker at a lower portion of the at least one side wall than an upper portion of the at least one side wall.

In another embodiment of the present disclosure, another method is provided. The other method includes receiving a substrate including at least one trench formed therein. The at least one trench has at least one side wall, wherein the at least one side wall of the trench includes a non-conformal layer that coats an upper portion of the at least one side wall without coating a lower portion of the at least one side wall. The method may also include selectively oxidizing the substrate to form an oxide layer on the at least one side wall, wherein the non-conformal layer is converted into a gas and is removed from the at least one side wall as the oxide layer forms. The oxide layer may be thicker at the lower portion of the at least one side wall than the upper portion of the at least one side wall of the at least one trench.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Many devices generated using nano-fabrication and micro-fabrication processes (e.g., semiconductor devices) are oxidized to form an oxide layer on the structures of the devices during manufacture of the devices. The oxide layer may serve multiple purposes, depending on the nature of the devices, where the oxide layer is formed, and/or other variables. The thickness of the oxide layer may be controlled in order to minimize performance variation of devices and/or to enable adequate yield. The oxide layer formed on the substrate in embodiments of the present disclosure is a tapered layer, such that the oxide layer is thicker on a lower portion than the upper portion.

Embodiments disclosed herein describe a method for selectively oxidizing a substrate. The method for selectively oxidizing a substrate may include forming a non-conformal layer on at least one side wall of a trench or other high aspect feature (e.g., such as a hole) formed on a substrate. The non-conformal layer forms on an upper portion of the at least one side wall and decreases in thickness with increased depth into the trench or other high aspect ratio feature. The non-conformal layer may include nitrogen or carbon in embodiments. The method may further include oxidizing the at least one trench or other high aspect ratio feature including the non-conformal layer. The oxidation of the non-conformal layer and an exposed portion of the at least one side wall not covered by the non-conformal layer occurs to form an oxide layer. The oxide layer may be thicker at a lower portion of the at least one side wall than the upper portion of the at least one side wall due to the presence of the non-conformal layer on the side wall.

In some embodiments of the method, the oxidizing may include an initial oxidizing process having a first selectivity, and at least one additional oxidizing process having a second selectivity. In some embodiments, the initial oxidizing process may be performed to achieve a target taper for the oxide layer, and the at least one additional oxidizing process is performed to achieve a target thickness of the oxide layer. In some embodiments, the initial oxidizing process may be performed to achieve about 5% to about 50% of the thickness of the oxide layer, and the at least one additional oxidizing process may be performed to achieve the remaining oxide layer.

Embodiments are discussed herein with respect to forming non-conformal layers and ultimately oxide layers on side walls of trenches of substrates. However, it should be understood that trenches are one example of high aspect ratio (HAR) features that the techniques described herein may operate on. It should be further understood that the techniques described herein with respect to trenches work equally well for any other type of high aspect ratio feature. A high aspect ratio feature may be a feature (e.g., such as a trench, hole, channel, etc.) having a length/depth to width/diameter ratio that is greater than a length/depth to width/diameter ratio threshold. The length/depth to width/diameter ratio threshold may be, for example, 5:1, 10:1, 20:1, 50:1, 100:1, 200:1, 300:1, or another threshold. Additionally, it should be understood that embodiments also apply to selective oxidation of features on substrates that are not high aspect ratio features.

In some embodiments, the forming of the non-conformal layer is achieved through a chemical vapor deposition (CVD) process, an atomic layer deposition (ALD) process, a radical plasma process (e.g., a radical plasma deposition or growth process), or a thermal process. In an embodiment using a chemical vapor deposition (CVD) process or atomic layer deposition (ALD) process, the process may be tuned to deposit more on the upper portion of the substrate when compared to the lower portion of the substrate. In some embodiments of the CVD and/or ALD process, this may be achieved by a combination or sequential cycling of ammonia and a precursor for nonconformal deposition that may be performed at a temperature of about 250° C. to about 750° C. The precursor may be dischlorosilane (DCS), hexachlorodisilane (HCDS), or a combination thereof. In an embodiment using a radical plasma process, a remote plasma process may be used including using nitrogen, ammonia, hydrogen, argon (Ar), helium (He), or a combination thereof. In an embodiment using a thermal process, ammonia may be used. In either the radical plasma process or thermal process, the process may be performed at a temperature of about 250° C. to about 1250° C. for about 5 seconds to about 4 hours. The pressure may be selected to ensure more deposition or growth of the non-conformal layer at upper portion of the substrate compared to the lower portion of the substrate.

In some embodiments, the oxidizing may be performed through thermal oxidation. Thermal oxidation is known in the art. During thermal oxidation, a oxygen source is introduced into a chamber containing the substrate while the substrate is heated to an elevated temperature, and a layer of oxide is grown on the surface of a substrate. In some embodiments, the thermal oxidation may be performed with an oxidizing plasma. In another embodiment, the thermal oxidation may be performed without an oxidizing plasma.

In some embodiments of the method, the oxide layer formed on the at least one side wall may be silicon dioxide. For example, if the side wall is formed of silicon or polysilicon, then the oxide may react with the silicon or polysilicon to form silicon dioxide.

In certain embodiments of the method, selectively oxidizing the at least one trench may include the non-conformal layer reacting with an oxidizing agent to grow the oxide layer on the non-conformal layer, while the non-conformal layer may be concurrently converted to a gas and removed from the at least one side wall. Alternatively, or additionally, the oxidizing agent may react with the oxide layer to form a gas, consuming a portion of the non-conformal layer.

In some embodiments of the method, the non-conformal layer may have a thickness of about 5 Å to about 50 Å, about 10 Å to about 45 Å, about 15 Å to about 40 Å, about 20 Å to about 35 Å, or about 25 Å to about 30 Å, or any sub-range therein. In some embodiments, the non-conformal layer may have a thickness of about 5 Å, about 10 Å, about 15 Å, about 20 Å, about 25 Å, about 30 Å, about 35 Å, about 40 Å, about 45 Å, or about 50 Å, or any value therein.

In some embodiments of the method, the non-conformal layer does not form on the lower portion of the at least one side wall, resulting in the lower portion of the at least one side wall being the exposed portion of the at least one side wall. In embodiments, the non-conformal layer is a tapered layer that is thickest at a top or entrance of the trench and that becomes progressively thinner as a depth into the trench increases.

In some embodiments, the non-conformal layer forms on about 25% of the at least one side wall, on about 50% of the at least one side wall, on about 75% of the at least one side wall, or about 80% of the at least one side wall.

In some embodiments of the method, the selective oxidation may be performed using an oxidizing agent comprising peroxide, steam ($H_2O$), or $H_2:O_2$, wherein $H_2$ and $O_2$ are in ratio of 5.5:1 to about 9:1. In some embodiments of the method, the substrate may be or include, silicon, polysilicon and/or silicon nitride.

In another embodiment of the present disclosure, an article is provided. The article may include a substrate, wherein the substrate includes at least one trench formed therein, the at least one trench having a top surface, a bottom surface, and at least one side wall. The article may further include an oxide layer on the at least one side wall of the at least one trench, wherein the oxide layer is thicker at a lower portion of the at least one side wall than an upper portion of the at least one side wall. The oxide layer on the side wall of the at least one trench of the article may have been formed in accordance with methods described herein.

In certain embodiments of the article, the oxide layer on the lower portion of the at least one side wall may have a thickness of about 50 Å to about 100 Å, about 55 Å to about 95 Å, about 60 Å to about 90 Å, about 65 Å to about 85 Å, or about 70 Å to about 80 Å, or any value or sub-range therein. The oxide layer may be a tapered oxide layer that is thicker at or near a bottom of the trench and thinner at or near a top of the trench. In certain embodiments of the article, the oxide layer on the upper portion of the at least one side wall may have a thickness of about 25 Å to about 50 Å, or may be about 25 Å, about 30 Å, about 35 Å, about 40 Å, about 45 Å, or about 50 Å, or any sub-range or value therein.

Heretofore nanofabrication processes and microfabrication processes have not been able to form tapered layers on high aspect ratio features, where the layer is thickest at the deepest regions of the high aspect ratio features (e.g., those features furthest from an uppermost region of the features). Embodiments described herein enable formation of tapered oxide layers on high aspect ratio features, which can be beneficial for certain types of devices, such as certain types and/or structures of semiconductor devices.

In yet another embodiment, a method is provided. The method includes receiving a substrate including at least one trench formed therein, the at least one trench having at least one side wall. The at least one side wall of the trench includes a non-conformal layer that coats an upper portion of the at least one side wall without coating a lower portion of the at least one side wall. The method further includes selectively oxidizing the substrate to form an oxide layer on the at least one side wall, wherein the non-conformal layer is converted into a gas and is removed from the at least one side wall as the oxide layer forms. The oxide layer is thicker at the lower portion of the at least one side wall than the upper portion of the at least one side wall of the at least one trench.

As used herein, the term "substrate" refers to a surface, or portion of a surface, upon which a process acts. Examples of substrates include semiconductor wafers (optionally with one or more features, layers, etc. formed thereon, displays (optionally with one or more features, layers, etc. formed thereon), and so on. It will also be understood by those skilled in the art that reference to a substrate can also refer to only a portion of the substrate, unless the context clearly indicates otherwise. Additionally, reference to depositing on a substrate can mean both a bare substrate and a substrate with one or more films/layers or features deposited or formed thereon.

A substrate as used herein may also refer to any substrate or material surface formed on a substrate upon which film processing is performed during a fabrication process. For example, a substrate surface on which processing can be performed include materials such as silicon, polysilicon, silicon oxide, strained silicon, silicon on insulator (SOI), carbon doped silicon oxides, silicon nitride, doped silicon, silicon germanium, and any other materials such as metals, metal nitrides, metal alloys, and other conductive materials, depending on the application. Substrates include, without limitation, semiconductor wafers.

Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface may comprise a metal, metal oxide, or H-terminated $Si_xGe_{1-x}$, and the second substrate surface may comprise a Si-containing dielectric, or vice versa. In some embodiments, a substrate surface may comprise certain functionality (e.g., —OH, —NH, etc.).

Figure 1:
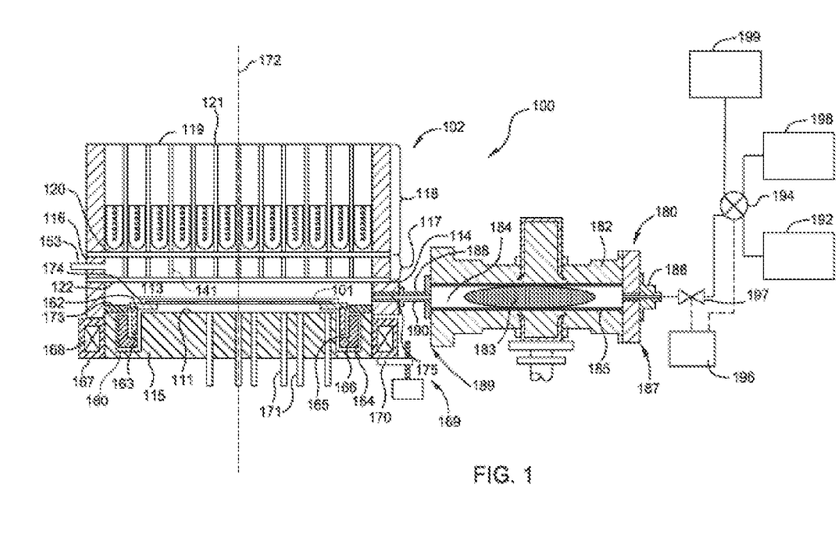
FIG. 1 depicts a cross-sectional view of a remote plasma system.

Referring now to the figures, FIG. 1 illustrates a substrate processing system 100 that may be used to perform the methods of selectively oxidizing described herein. Other deposition chambers may also benefit from the present disclosure and the parameters disclosed herein may vary according to the particular deposition chamber used to form the HAR structures described herein. For example, other deposition chambers may have a larger or smaller volume, using gas flow rates that are larger or smaller than the gas flow rates of the present disclosure.

The substrate processing system 100 includes a thermal processing chamber 102 and a precursor activator 180 that couples to the thermal processing chamber 102 and is used to remotely provide radicals of a plasma to the processing region 113 of the thermal processing chamber 102. The precursor activator 180 can also be used to provide an activated gas mixture that is not a plasma, for example by applying energy to a gas that does not significantly ionize the gas. The thermal processing chamber 102 has a processing region 113 enclosed by one or more sidewall(s) 114 (e.g., four sidewalls) and a base 115. The upper portion of sidewall 114 may be sealed to a window assembly 117 (e.g., using "O" rings). A radiant energy assembly 118 is positioned over and coupled to window assembly 117. The radiant energy assembly 118 has a plurality of lamps 119, which may be tungsten halogen lamps, each mounted into a receptacle 121 and positioned to emit electromagnetic radiation into the processing region 113. The window assembly 117 of FIG. 1 has a plurality of light pipes 141, but the window assembly 117 may just have a flat, solid window with no light pipes. The window assembly 117 has an outer wall 116 (e.g., a cylindrical outer wall) that forms a rim enclosing the window assembly 117 around a circumference thereof. The window assembly 117 also has a first window 120 covering a first end of the plurality of light pipes 141 and a second window 122 covering a second end of the plurality of light pipes 141, opposite the first end. The first window 120 and second window 122 extend to, and engage with, the outer wall 116 of the window assembly 117 to enclose and seal the interior of the window assembly 117, which includes the plurality of light pipes 141. In such cases, when light pipes are used, a vacuum can be produced in the plurality of light pipes 141 by applying vacuum through a conduit 153 through the outer wall 116 to one of the plurality of light pipes 141, which is in turn fluidly connected to the rest of the pipes.

A substrate 101 is supported in the thermal processing chamber 102 by a support ring 162 within the processing region 113. The support ring 162 is mounted on a rotatable cylinder 163. By rotating the rotatable cylinder 163, the support ring 162 and substrate 101 are caused to rotate during processing. The base 115 of the thermal processing chamber 102 has a reflective surface 111 for reflecting energy onto the backside of the substrate 101 during processing. Alternatively, a separate reflector (not shown) can be positioned between the base 115 of the thermal processing chamber 102 and the support ring 162. The thermal processing chamber 102 may include a plurality of temperature probes 171 disposed through the base 115 of the thermal processing chamber 102 to detect the temperature of the substrate 101. In the event a separate reflector is used, as described above, the temperature probes 171 are also disposed through the separate reflector for optical access to electromagnetic radiation coming from the substrate 101.

The rotatable cylinder 163 is supported by a magnetic rotor 164, which is a cylindrical member having a ledge 165 on which the rotatable cylinder 163 rests when both members are installed in the thermal processing chamber 102. The magnetic rotor 164 has a plurality of magnets in a magnet region 166 below the ledge 165. The magnetic rotor 164 is disposed in an annular well 160 located at a peripheral region of the thermal processing chamber 102 along the base 115. A cover 173 rests on a peripheral portion of the base 115 and extends over the annular well 160 toward the rotatable cylinder 163 and support ring 162, leaving a tolerance gap between the cover 173 and the rotatable cylinder 163 and/or the support ring 162. The cover 173 generally protects the magnetic rotor 164 from exposure to process conditions in the processing region 113.

The magnetic rotor 164 is rotated by magnetic energy from a magnetic stator 167 disposed around the base 115. The magnetic stator 167 has a plurality of electromagnets 168 that, during processing of the substrate 101, are powered according to a rotating pattern to form a rotating magnetic field that provides magnetic energy to rotate the magnetic rotor 164. The magnetic stator 167 is coupled to a linear actuator 169, which in this case is a screw drive, by a support 170. Operating the linear actuator 169 moves the magnetic stator 167 along an axis 172 of the thermal processing chamber 102, which in turn moves the magnetic rotor 164, the rotatable cylinder 163, the support ring 162, and the substrate 101 along the axis 172.

Processing gas is provided to the thermal processing chamber 102 through a chamber inlet 175, and exhausts through a chamber outlet oriented out of the page and generally along the same plane as the chamber inlet 175 and the support ring 162 (not shown in FIG. 1). Substrates enter and exit the thermal processing chamber 102 through an access port 174 formed in the sidewall 114 and shown at the rear in FIG. 1. The substrate transportation process is not described herein.

The precursor activator 180 has a body 182 surrounding an interior space 184 where a plasma 183 of ions, radicals, and electrons can be formed. A liner 185 made of quartz or sapphire protects the body 182 from chemical attack by the plasma. The interior space 184 preferably does not have any electrical potential gradient present that might attract charged particles, e.g., ions. A gas inlet 186 is disposed at a first end 187 of the body 182 and opposite from a gas outlet 188 that is located at a second end 189 of the body 182. When the precursor activator 180 is coupled to the thermal processing chamber 102, the gas outlet 188 is in fluid communication with the thermal processing chamber 102 through a delivery line 190 to chamber inlet 175, such that radicals of the plasma 183 generated within the interior space 184 are supplied to the processing region 113 of the thermal processing chamber 102. The gas outlet 188 may have a diameter larger than the gas inlet 186 to allow the excited radicals to be efficiently discharged at a targeted flow rate, and to minimize the contact between the radicals and the liner 185. If targeted, a separate orifice may be inserted within the liner 185 at the gas outlet 188 to reduce an inner dimension of the interior space 184 at the gas outlet 188. The diameter of the gas outlet 188 (or orifice, if used) can be selected to provide a pressure differential between the processing region 113 and the precursor activator 180. The pressure differential may be selected to yield a composition of ions, radicals, and molecules flowing in to the thermal processing chamber 102 that is suitable to processes being performed in the thermal processing chamber 102.

To provide gas for plasma processing, a first gas source 192 is coupled to the gas inlet 186 via a first input of a four-way valve 194 and a valve 197 used to control the flow rate of gas released from the first gas source 192. A second input of the four-way valve 194 may be coupled to a second gas source 198. A third input of the four-way valve may be coupled to a third gas source 199. Each of the first gas source 192, the second gas source 198, and the third gas source 199 may be, or include, one or more of a nitrogen-containing gas, an oxygen-containing gas, a silicon-containing gas, a hydrogen-containing gas, or a plasma forming gas such as argon or helium. A flow controller 196 is connected to the four-way valve 194 to switch the four-way valve 194 between its different positions, depending upon which process is to be carried out. The flow controller 196 also controls switching of the four-way valve 194.

The precursor activator 180 may be coupled to an energy source (not shown) to provide an excitation energy, such as an energy having a microwave or RF frequency, to the precursor activator 180 to activate the process gas traveling from the first gas source 192 into the plasma 183. In the case where nitrogen-containing gas, for example, $N_2$, is used, the plasma activation in precursor activator 180 produces N* radicals, positively charged ions such as N+ and $N_2$+, and electrons in the interior space 184. By locating the precursor activator 180 remotely from the processing region 113 of thermal processing chamber 102, exposure of the substrate to ions can be minimized. Ions can damage sensitive structures on a semiconductor substrate, whereas radicals are reactive and can be used to perform beneficial chemical reactions. Use of an activated gas source such as the precursor activator 180 promotes exposure of the substrate 101 to radicals and minimizes exposure of the substrate 101 to ions.

In some implementations, a second hydrogen gas source (not shown) is fluidly coupled with the thermal processing chamber 102. The second hydrogen gas source delivers hydrogen gas to the processing region 113 where the hydrogen gas may be activated by the remote plasma delivered from the precursor activator 180 to the processing region 113. In some implementations where a high percentage of hydrogen gas is targeted, hydrogen gas may be supplied to the processing region 113 through both the third gas source 199 and the second hydrogen gas source.

Figure 2:
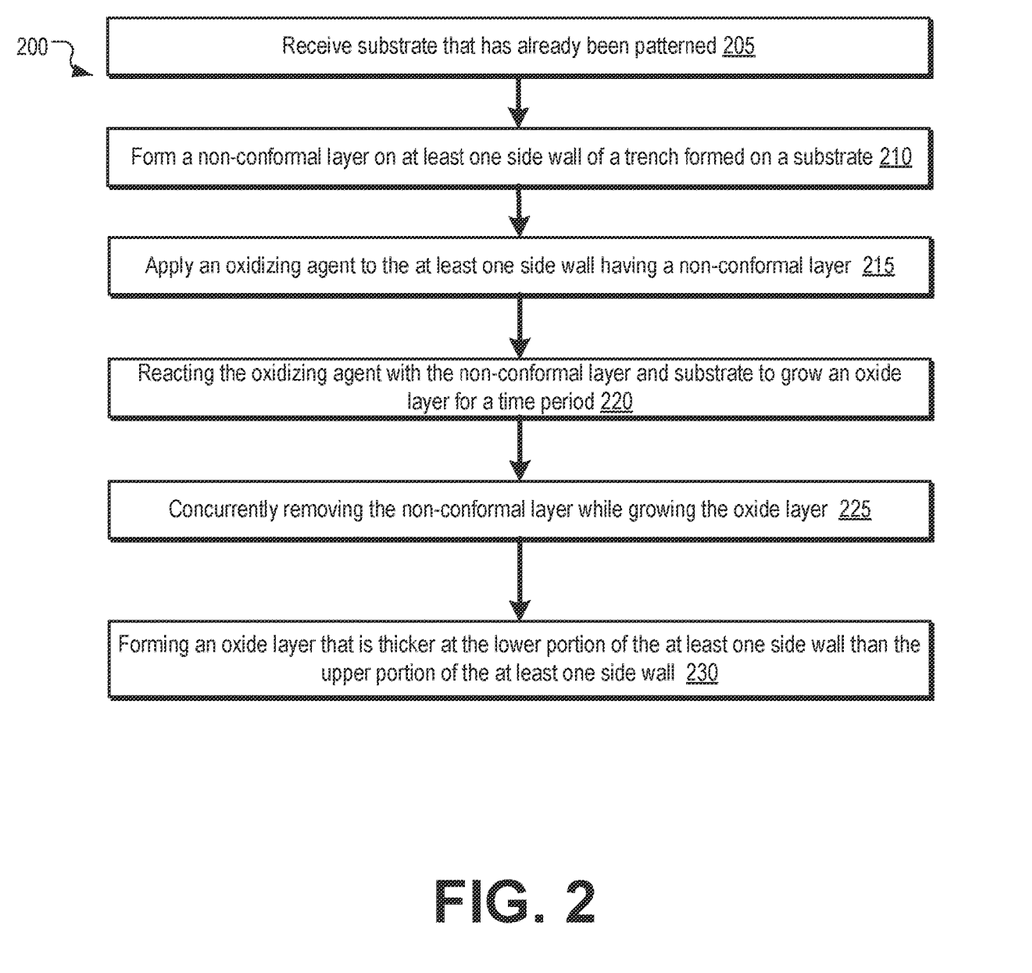
FIG. 2 is a flow chart representing a method for selectively oxidizing a substrate according to an embodiment of the present disclosure.

FIG. 2 is a flow chart representing a method 200 of selectively oxidizing a substrate according to an embodiment of the present disclosure. In the method 200, at block 205, a substrate is received that has already been patterned. The substrate may be patterned to have at least one trench and/or other feature. The substrate will be discussed with reference to trenches, but it should be understood that the trench might be replaced with any other type of feature, which may be a high aspect ratio feature.

Figure 3A:
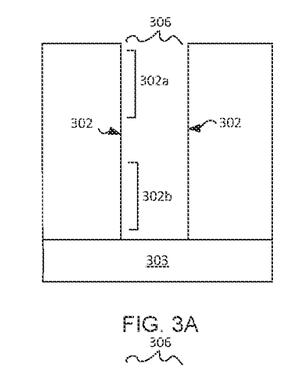
FIG. 3A illustrates the trench of a substrate, according to an embodiment of the present disclosure.

The at least one trench may have a top surface, at least one side wall surface and a bottom surface. For example, the substrate may have a trench as show in FIG. 3A. FIG. 3A illustrates the trench 306 of a substrate 303, according to an embodiment of the present disclosure.

In FIG. 3A, a substrate 303 is shown having trench 306. The substrate 303 may include silicon or silicon nitride. The trench 306 has at least one side wall 302. The trench may have been etched into the substrate (e.g., into a silicon wafer) and/or may have been etched or otherwise formed in one or more layers formed on a surface of the substrate. In embodiments, the walls 302 of the trench are formed of a same material as a bottom of the trench. In other embodiments, the walls 302 of the trench are formed of a different material from the bottom of the trench (e.g., such as if silicon nitride layer(s) have been formed on a silicon wafer, and the silicon nitride layer(s) were etched to expose the silicon wafer at a bottom of the trench). The at least one side wall 302 in some embodiments may have a layer (not pictured) formed on the side wall 302. The layer may include silicon nitride (SiN) in one embodiment. In other embodiments, the layer may be silicon, damaged silicon nitride, silicon oxide, or low κ material. As understood herein, the term "low κ material" refers to a material with a small relative dielectric constant (κ, kappa) relative to silicon dioxide. The method 200 of the present disclosure allows for the formation of an oxide layer that is thicker on the lower portion 302b of the at least one side wall than the upper portion 302a of the at least one side wall 302 because of selective oxidation of the at least one trench 306.

Figure 3B:
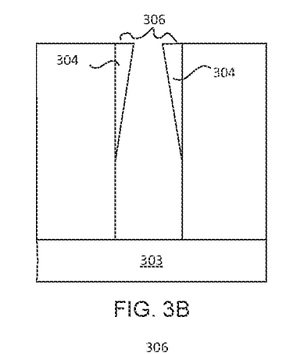
FIG. 3B illustrates the trench of FIG. 3A after deposition of a non-conformal layer on a sidewall of the trench, according to an embodiment of the present disclosure.

Referring back to FIG. 2, after receiving the patterned substrate, a non-conformal layer may be formed on the at least one side wall of a trench formed on the substrate in block 210. This can be seen in FIG. 3B. FIG. 3B illustrates the trench 306 of FIG. 3A after deposition of a non-conformal layer 304 on a sidewall 302 of the trench 306, according to an embodiment of the present disclosure.

In FIG. 3B, non-conformal layer 304 is formed onto upper portion 302a of the at least one side wall 302. In some embodiments, the non-conformal layer 304 may also be known as a "poison" layer or a "retard" layer. Such a non-conformal layer 304 acts as a barrier to control the oxidation rates of the trench in the substrate in embodiments.

The non-conformal layer 304 is a tapered layer that decreases in thickness with increased depth into the trench 306. The non-conformal layer has a thickness of about 5 Å to about 50 Å at the upper portion of the at least one side wall 302. In some embodiments, the non-conformal layer 304 may have a thickness of about 5 Å, about 10 Å, about 15 Å, about 20 Å, about 25 Å, about 30 Å, about 35 Å, about 40 Å, about 45 Å, or about 50 Å at the upper portion 302a of the at least one side wall 302. As can be seen in FIG. 3B, the non-conformal layer 304 may not form on the lower portion 302b of the at least one side wall 302, resulting in the lower portion 302b of the at least one side wall being an exposed portion of the at least one side wall 302. In some embodiments, the non-conformal layer 304 forms on about 50% of the at least one side wall 302, on about 55% of the at least one side wall 302, on about 60% of the at least one side wall 302, on about 65% of the at least one side wall 302, on about 70% of the at least one side wall 302, on about 75% of the at least one side wall 302, on about 80% of the at least one side wall 302, on about 85% of the at least one side wall 302, or on about 90% of the at least one side wall 302.

In some embodiments, the non-conformal layer 304 is a layer that includes nitrogen. In some embodiments, the non-conformal layer 304 is a nitride layer, such as silicon nitride. In some embodiments, the non-conformal layer 304 includes carbon. In some embodiments, the non-conformal layer 304 is a carbide layer, such as a silicon carbide layer.

The forming of the non-conformal layer may be achieved through a chemical vapor deposition (CVD) process or a radical plasma process (e.g., a radical plasma deposition or growth process). During the radical plasma process, a remote plasma containing radicals may be generated. The remote plasma may include a nitrogen plasma (e.g., with nitrogen radicals), an ammonia plasma (e.g., with ammonia radicals), or a combination thereof. The radical plasma process may be performed in a relatively high pressure regime (e.g., at or above 1 Torr), and creates an excited state in the high pressure regime. For example, if nitrogen plasma is used, a $N_2^*$ excited state may be created. In another example, if ammonia plasma is used, then a $NH_2$ or a NH radical fragment may be created. The pressure should be controlled to be low enough to cause a reaction with the substrate. For example, the pressure may be controlled to produce a radical lifetime that focuses the radical plasma process near the upper portion of the substrate. Additionally, the time for the process should also be set to a short time period (e.g., about 5 seconds to about 4 hours) to allow for selective reaction on target regions (e.g., upper portion 302a) of the substrate. In some embodiments, the pressure for performing the radical plasma process may be about 0.5 Torr (T) to about 5 T, or about 0.5 T, about 1 T, about 2 T, about 3 T, about 4 T, about 5 T, or any value or sub range therein. The time period for performing the radical plasma process may be about 5 seconds to about 1 hour. By performing a radical plasma process for formation of the non-conformal layer 304, the energy of the radicals can be controlled such that the radicals cannot react along the entire side wall 302, but can selectively react with the upper portion 302a of the side walls 302 of the substrate (e.g., without reaching or reacting with lower portion 302b of the side wall 302). In another embodiment, a thermal process may be performed at similar conditions except that the pressure may be about 0.5 T to about 500 T.

In some embodiments, the non-conformal layer 304 is formed via CVD or ALD. Various types of CVD processes exist and the specific type may be selected based on several factors such as the surface to be coated, the coating material, chemical interaction between the surface and the coating material, target thickness, target coating properties, etc. Some examples of CVD processes include atmospheric CVD (APCVD), low pressures CVD (LPCVD), plasma enhanced CVD (PECVD), vapor phase epitaxy, and so on. Any of these CVD processes may be used in embodiments. For the various CVD processes, a substrate is exposed to one or more volatile precursors, which react and/or decompose on the article surface to produce a target coating. Byproducts may be produced, which are removed by evacuating the byproducts from the deposition chamber in which the CVD process is performed.

Figure 4:
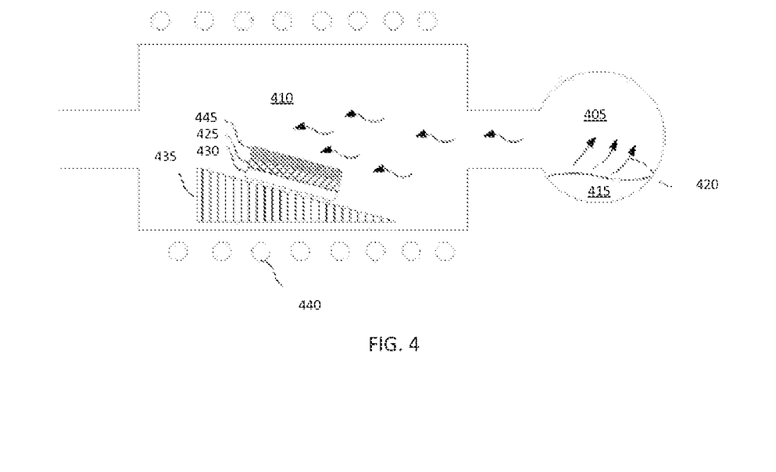
FIG. 4 illustrates an exemplary chemical vapor deposition (CVD) system.

FIG. 4 depicts an exemplary chemical vapor deposition (CVD) system that may be utilized for coating an article, in accordance with an embodiment.

The system comprises a chemical vapor precursor supply system 405 and a CVD reactor 410. The role of the vapor precursor supply system 405 is to generate vapor precursors 420 (such as vapor precursor for non-conformal layer 304, from a starting material 415, which could be in a solid, liquid, or gas form. The vapors are then transported into the CVD reactor 410 and get deposited as thin film 445 on a substrate 430 (e.g., which may correspond to substrate 300A of FIG. 3A) which may be positioned on a holder 435.

CVD reactor 410 heats substrate 430 to a deposition temperature using heater 440. In some embodiments, the heater may heat the CVD reactor's wall (also known as "hot-wall reactor") and the reactor's wall may transfer heat to the substrate 430. In other embodiments, the substrate alone may be heated while maintaining the CVD reactor's wall cold (also known as "cold-wall reactor"). It is to be understood that the CVD system configuration should not be construed as limiting. A variety of equipment could be utilized for a CVD system and the equipment is chosen to obtain optimum processing conditions that may give a coating with uniform thickness, surface morphology, structure, and composition.

The various CVD processes comprise of the following process steps: (1) generate active gaseous reactant species (also known as "precursors") from the starting material; (2) transport the precursors into the reaction chamber (also referred to as "reactor"); (3) absorb the precursors onto the heated substrate (i.e., onto upper portion 302a of the substrate 300A); (4) participate in a chemical reaction between the precursor and the substrate at the gas-solid interface to form a deposit and a gaseous by-product; and (5) remove the gaseous by-product and unreacted gaseous precursors from the reaction chamber.

Suitable CVD precursors may be stable at room temperature, may have low vaporization temperature, can generate vapor that is stable at low temperature, have suitable deposition rate (low deposition rate for thin film coatings and high deposition rate for thick film coatings), relatively low toxicity, be cost effective, and relatively pure. For some CVD reactions, such as thermal decomposition reaction (also known as "pyrolysis") or a disproportionation reaction, a chemical precursor alone may suffice to complete the deposition. For other CVD reactions, other agents or reactants (such as oxygen containing or fluorine containing reactants) in addition to a chemical precursor may be utilized to complete the deposition to form a metal fluoride protective coating such as those described herein.

CVD has many advantages including its capability to deposit highly dense and pure coatings with good reproducibility and adhesion at reasonably high deposition rates. Layers deposited using CVD in embodiments may have a porosity of below 1%, and a porosity of below 0.1% (e.g., around 0%). Therefore, it can be used to coat complex shaped components and deposit non-conformal films when sufficiently low amounts of precursor are used that the precursor does not reach (or lesser amounts of precursor reaches) regions that are not targeted to have the deposited layer.

Referring back to FIG. 3B, in some embodiments the non-conformal layer 304 may include nitrogen. In some embodiments, the non-conformal layer 304 may also include silicon. For example, the non-conformal layer 304 may include silicon nitride. In some embodiments, the non-conformal layer 304 including nitrogen is formed by performing nitridation of the substrate 303. Nitridation may be achieved by applying nitrogen ($N_2$), ammonia ($NH_3$), hydrogen ($H_2$), argon (Ar), helium (He), or a combination thereof. In some embodiments, the nitridation may be achieved with a plasma. The plasma may include nitrogen ($N_2$), ammonia ($NH_3$), hydrogen ($H_2$), argon (Ar), helium (He), or a combination thereof. In some embodiments, the nitridation may be achieved by applying ammonia to the substrate, either with or without a plasma. The nitridation may be performed at a pressure of about 0.5 T to about 5 T, about 0.5 T, about 1 T, about 2 T, about 3 T, about 4 T, or about 5 T, or any value or sub-range therein. The nitridation may be performed at a temperature of about 250° C. to about 1250° C., about 350° C. to about 1150° C., about 450° C. to about 1050° C., about 550° C. to about 950° C., about 650° C. to about 850° C., or about 250° C., about 350° C., about 450° C., about 550° C., about 650° C., about 750° C., about 950° C., about 1050° C., about 1150° C., or about 1250° C., or any value or sub-range therein.

In certain embodiments, a native oxide may form on a surface of the substrate 303 (e.g., on side walls 302 of the substrate 303) prior to formation of the non-conformal layer 304. For example, if the substrate 303 is exposed to oxygen and/or moisture, a native oxide may form. The native oxide may impede the formation of the non-conformal layer 304 in embodiments. Accordingly, in embodiments a clean or etch process is performed to remove the native oxide prior to formation of the non-conformal layer 304.

Referring back to FIG. 2, after the non-conformal layer is formed on a portion of the at least one side wall of the trench, an oxidizing agent is applied to the at least one side wall having the non-conformal layer at block 215. The oxidizing agent may be comprising peroxide, steam ($H_2O$), or $H_2:O_2$, wherein $H_2$ and $O_2$ are in ratio of 5.5:1 to about 9:1. In embodiments, the oxidizing agent is applied while the substrate is heated.

The oxidizing agent is chosen based on its selectively to oxidize the substrate. In some embodiments, it is preferred to have an oxidizing agent that is highly selective to react quickly with the material in the substrate, i.e. silicon, while reacting more slowly with the non-conformal layer, i.e. nitrogen or carbon-containing layer. For example, a hydrogen (H) rich oxidizing agent may be more selective during this step. In another example, steam ($H_2O$) and/or hydrogen peroxide ($H_2O_2$) may be a selective oxidizing agent. In contrast, oxygen radicals (O*) and/or hydroxide (OH) may be less selective.

Figure 3C:
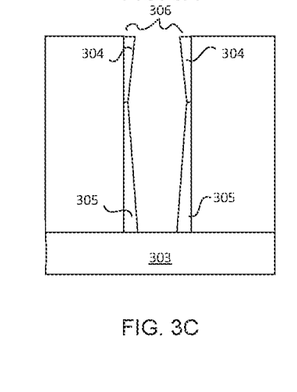
FIG. 3C illustrates the trench of FIG. 3B before completion of an oxidation operation, according to an embodiment of the present disclosure.

In block 220, the oxidizing agent reacts with the non-conformal layer and the substrate to grow an oxide layer thereon for a time period. As can be seen in FIG. 3C, an oxide layer 305 grows along the at least one side wall 302 of the trench 306, while the non-conformal 304 layer reduces on the at least one side wall 306. FIG. 3C illustrates the trench of FIG. 3B after an oxidation process has begun and before completion of the oxidation process, according to an embodiment of the present disclosure.

The time period for reacting the oxidizing agent may depend on the selectively of the oxidizing agent. In some embodiments, the time period may be about 30 seconds, about 45 seconds, about 1 minute, about 5 minutes, about 10 minutes, about 15 minutes, about 20 minutes, about 30 minutes, about 45 minutes, about 1 hour, about 2 hours, about 3 hours, about 4 hours, about 5 hours, or about 6 hours, or any value within.

In some embodiments, multiple different oxidizing chemistries may be used. For example, a first oxidation step may be performed using a first oxidizing agent having a first selectivity (e.g., a lower selectivity between the bare portions of the side walls 302 and the portions of the side walls covered with the non-conformal layer) and a second oxidation step may be performed using a second oxidizing agent having a second selectivity (e.g., a higher selectivity between the bare portions of the side walls 302 and the portions of the side walls covered with the non-conformal layer). A first time period for the first oxidation step and a second time period for the second oxidation step may be selected to tune a selectivity of the overall oxidation process to a target selectivity that may be between the first selectivity of the first oxidation step and the second selectivity of the second oxidation step. Additional oxidation steps may be performed to control the selectivity of the oxidation.

Referring back to FIG. 2, the non-conformal layer is concurrently removed from the trench while growing the oxide layer in block 225. In some embodiments, as the oxidizing agents reacts with the non-conformal layer, it may cause a portion of the non-conformal layer to convert into a gas phase. The gas phase of the reacted portion of the non-conformal layer may then be removed from the process chamber in which the oxidation is performed (e.g., by pumping out the reaction byproducts). For example, if the non-conformal layer includes nitrogen, the oxidizing agent may react with both the substrate and nitrogen, such that an oxide layer begins to grow on the exposed portion of the at least one side wall of the trench of the substrate while causing the nitrogen to convert to a gas so that the oxide layer will eventually replace it. Thus, the oxidizing layer may only grow on the substrate itself because the non-conformal layer is removed during the selective oxidation process.

Figure 3D:
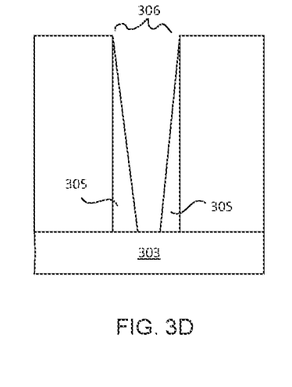
FIG. 3D illustrates the trench of FIG. 3B after completion of the oxidation operation, according to an embodiment of the present disclosure.

In block 230, an oxide layer is formed that is thicker at the lower portion of the at least one side wall than the upper portion of the at least one side wall. This is also illustrated in FIG. 3D. FIG. 3D illustrates the trench of FIG. 3B after completion of the oxidation operation, according to an embodiment of the present disclosure. As can be seen in FIG. 3D, the oxide layer 205 is thicker at the lower portion 302b of the trench and gradually thins out near the upper portion 302a of the side wall 302 of the trench 306. In some embodiments, the oxide layer grows to form a thicker layer on the lower, exposed portion of the at least one side wall of the trench of the substrate because the non-conformal layer (e.g., nitride) oxidizes slower than the exposed portions of the side wall (e.g., than silicon). Thus, the rate of oxidation and the degree of taper will be controlled to reach a target thickness and a target amount of taper (e.g., a target thickness profile across the surface of the trench side wall in embodiments.

In some embodiments, the oxide layer on the lower portion of the at least one side wall may have a thickness of about 50 Å to about 100 Å, about 55 Å to about 95 Å, about 60 Å to about 90 Å, about 65 Å to about 85 Å, or about 70 Å to about 80 Å, or any value or sub-range therein. In some embodiments, the oxide layer on the lower portion of the at least one side wall may have a thickness of about 50 Å, about 55 Å, about 60 Å, about 65 Å, about 70 Å, about 75 Å, about 80 Å, about 85 Å, about 90 Å, about 95 Å, or about 100 Å.

In some embodiments, the oxide layer on the upper portion of the at least one side wall may have a thickness of about 25 Å to about 50 Å, or may be about 25 Å, about 30 Å, about 35 Å, about 40 Å, about 45 Å, or about 50 Å, or any sub-range or value therein. In some embodiments, the oxide layer on the upper portion of the at least one side wall may have a thickness of about 25 Å, about 30 Å, about 35 Å, about 40 Å, about 45 Å, or about 50 Å.

In some embodiments, the oxide layer on the at least one side wall may gradually get thicker from the upper portion to the lower portion of the at least one side wall (e.g., may be tapered). The thickness of the lower and upper portions, as well as an amount of taper, may be controlled based on the non-conformal layer formed in earlier steps of the method, the selectivity of the oxidation process, and the time and/or temperature of oxidation.

In some embodiments, the method of selective oxidation may be performed in a first oxidation step to grow a target profile on the at least one side wall of the trench of the substrate, followed by second oxidation step (e.g., a radical oxidation step) to complete the oxidation of the trench of the substrate. The second oxidation step allows for the substrate to be oxidized at a quicker rate in embodiments. In embodiments, the first oxidation step has a higher selectivity but a lower oxide growth rate and the second oxidation step has a lower selectivity but a higher growth rate. In some embodiments, the complete oxidation (selective oxidation, followed by radical oxidation) of the trenches of the substate may be performed in less than about one hour.

As discussed above in some embodiments a native oxide may form on sidewalls of trenches of a substrate prior to formation of a non-conformal layer on the sidewalls of the trenches. In some embodiments, an electronic device manufacturing system that includes a cluster tool is used to process the substrates. The substrate may be maintained in a vacuum after formation of trenches in the substrate and before formation of the non-conformal layer on the sidewalls of the trenches. By moving the substrate between chambers without breaking vacuum, formation of a native oxide may be prevented.

Figure 5:
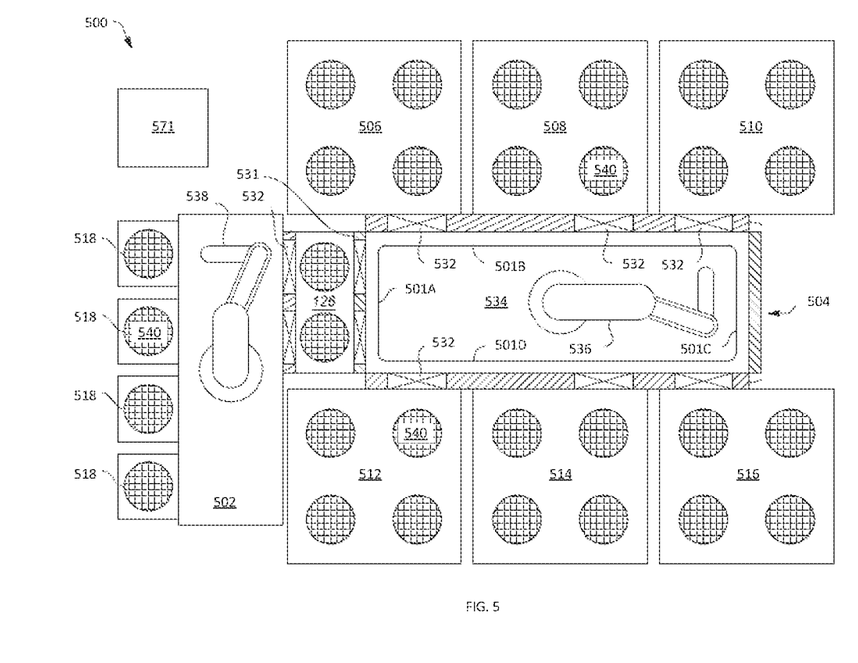
FIG. 5 illustrates a schematic top view of an electronic device manufacturing system.

FIG. 5 illustrates a schematic top view of an electronic device manufacturing system 500, in accordance with embodiments of the present disclosure. The electronic device manufacturing system 500 is configured to process substrates and may include a mainframe (also referred to as a transfer chamber) 504 having four facets 501A-D. Though four facets 501A-D are illustrated in a rectangular configuration, the mainframe 504 may alternatively have other numbers of facets (e.g., such as 5 facets, 6 facets, 7 facets, 8 facets, etc.) and/or other shapes. The facets may have the same sizes (e.g., the same widths) or different sizes in embodiments. In one embodiment, the mainframe 504 has a rectangular shape, with facets 501A and 501C being approximately parallel to one another, facets 501B and 501D being approximately parallel to one another, and facets 501A and 501C being approximately perpendicular to facets 501B and 501D. In one embodiment, the mainframe 504 has a pentagonal shape. In one embodiment, the mainframe includes a first facet having a first length, second and third facets on either side of the first facet, each having a second length that is greater than the first length, and a fourth and fifth facet connected to the second and third facet, respectively, each having a third length that is greater than or equal to the first length and less than the second length.

Mainframe 504 may include an interior volume 534, wherein facets 501A-D may define the side walls of the interior volume 534. The mainframe 504 may additionally include a base (not shown) and a lid (not shown). The facets 501A-D, base and lid may together define the interior volume 534. A robot arm (also referred to as a robot assembly) 536 may be disposed within the interior volume 534 of the mainframe 504. The interior volume 534 may typically be under vacuum during operation of the mainframe 504.

Each facet 501A-D may include one or more substrate access ports 532. Each substrate access port 532 may be configured to allow a horizontally-oriented substrate 540 to pass there through. Substrate 540 may be a wafer (e.g., a semiconductor wafer or a non-semiconductor device substrate), glass plate or panel, and/or other workpiece used to make electronic devices or circuit components. Each substrate access port 532 may be, e.g., an elongated slot or slit formed in a side wall of mainframe 504. Each substrate access port 532 each may include, e.g., a slit valve or other suitable device for opening and closing a substrate access port 532 and/or a local center finder (LCF) suitable for determining a position of a substrate 540 transferred through a substrate access port 532. Slit valves may be of any suitable conventional construction, such as, e.g., L-motion slit valves. Other suitable devices may also be used for opening and closing substrate access ports 532. Substrate access ports 532 may include single gates or dual gates (e.g., with a first gate on an interior of the replaceable interface plate at a substrate access port and a second gate on an exterior of the replaceable interface plate at the substrate access port) in embodiments.

Process chambers 506, 508, 510, 512, 514, 516 are attached various facets 501A-D of mainframe 504. Each of the process chambers 506-116 has a chamber port that lines up with a substrate access port 532.

Load lock chambers 126 may each be a batch-type or single substrate-type of load lock chamber. In some embodiments, load lock chamber 526 may be a stacked load lock chamber. For example, load lock chamber 126 may be a double-stacked load lock chamber, a triple-stacked load lock chamber, a load lock chamber with four or more stacked load locks (e.g., a quad load lock chamber), and so on. Alternatively, load lock chamber 126 may be a single volume load lock chamber. Each of load lock chambers 126 may have one or more chamber ports corresponding to a respective substrate access port 532. For example, a stacked load lock chamber 126, which may have two separate substrate volumes, may have two vertically-aligned chamber ports corresponding respectively to vertically aligned substrate access ports 532. A triple-stacked load lock chamber, which may have three separate substrate volumes, may have three vertically-aligned chamber ports corresponding to vertically aligned substrate access ports. Single volume load lock chambers may have a single chamber port corresponding to a single substrate access port 532. Any one or more of load lock chambers 126 may be a stacked load lock chamber, a triple-stacked load lock chamber, and/or a single volume load lock chamber. Also, in some embodiments, any one or more of load lock chambers 126 may be a process-capable chamber. That is, any one or more of load lock chambers 126, or any one of the volumes located therein, may be capable of performing a substrate pre-heating process, an abatement process, a cooling process, and/or another treatment process.

Mainframe 504, process chambers 506-516, and/or load lock chambers 526 may each operate at a vacuum pressure. Process chambers 506-516 may each perform a same or different process on a substrate 540 including, e.g., deposition, oxidation, nitridation, etching, polishing, cleaning, lithography, inspection, or the like. Other processes may also be performed therein.

Mainframe 504 may also include a robot assembly 536 in the interior volume 534. Robot assembly 536 may be configured to transfer one or more substrates 540 to and from each process chamber 506-516 and load lock chamber 526. Robot assembly 536 may be configured to transfer substrates 540 from any one chamber directly to any other chamber attached to mainframe 504. In some embodiments, substrates 540 may be transferred by robot assembly 536 in any sequence or direction. In some embodiments, robot assembly 536 may have dual transport blades (or more transport blades, also referred to as end effectors) each independently projectable and retractable to and from any chamber attached to mainframe 504, thus increasing system throughput by enabling concurrent substrate transfers. In some embodiments, robot assembly 536 may have a single transport blade and/or may be a SCARA (selective compliance articulated robot arm) robot. Alternatively, robot assembly 536 may be any suitable mechanism for transferring substrates between the chambers attached to mainframe 504, such as a linear robot or a non-linear robot.

Load lock chambers 126 may be coupled to a factory interface 502, which may be coupled to one or more FOUPs (front opening unified pods) 518. One or more load lock chambers 126 may provide a first vacuum interface between factory interface 502 and the transfer chamber 126. In some embodiments, each of load lock chambers 526 may increase substrate throughput by alternately communicating with mainframe (transfer chamber) 504 and factory interface 502. That is, while one load lock chamber 526, or any one volume of a stacked or triple-stacked load lock chamber, communicates with transfer chamber 504, the other load lock chambers 126, or the other volumes of a stacked or triple-stacked load lock chamber, may communicate with factory interface 502. Substrate transfers between factory interface 502, load lock chambers 126, and transfer chamber 504 may be made in any other suitable manner.

FOUPs 518 may each be a container having a stationary cassette therein for holding multiple substrates. FOUPs 518 may each have a front opening interface configured to be used with factory interface 502. Factory interface 502 may have a buffer chamber (not shown) and one or more robot assemblies 538 configured to transfer substrates 540 via linear, rotational, and/or vertical movement between FOUPs 518 and load lock chambers 126. Substrates may be transferred between FOUPs 518 and load lock chambers 126 in any sequence or direction. Load lock chambers 126 may each be a batch-type or single substrate-type of load lock chamber.

A controller 571 may control robot assembly 538, robot assembly 536 and/or the operation of the electronic device manufacturing system. The controller 571 may control the processing and transferring of substrates 540 in and through the electronic device manufacturing system. Controller 571 may be, e.g., a general purpose computer and/or may include a microprocessor or other suitable CPU (central processing unit), a memory for storing software routines that control electronic device manufacturing system, input/output peripherals, and support circuits (such as, e.g., power supplies, clock circuits, circuits for driving robot assembly 538, 536, a cache, and/or the like). Controller 571 may be programmed to, e.g., process one or more substrates sequentially through each of the process chambers attached to mainframe 504. In other embodiments, controller 571 may be programmed to process a substrate in any order through the process chambers. In still other embodiments, controller 571 may be programmed to skip and/or repeat processing of one or more substrates in one or more process chambers. Controller 571 may alternatively be programmed to process one or more substrates in the electronic device manufacturing system in any suitable manner.

The electronic device manufacturing system may have other suitable numbers of FOUPs 518 and/or load lock chambers 526 than those shown. In some embodiments, the number of load lock chambers coupled to facet 501A may be independent of the number of process chambers coupled to any one of facets 501B-D. For example, the number of load lock chambers may be different than the highest number of process chambers coupled to a facet. Also, in some embodiments, up to four process chambers may be coupled to a single facet, or more than four process chambers may be coupled to a single facet, depending on the size of mainframe 504 relative to the size(s) of the four process chambers.

In embodiments, a substrate may be moved into mainframe 504, and multiple processes may be performed by various process chambers 506-516 without breaking vacuum. For example, process chamber 506 may form trenches in the substrate, process chamber 508 may form a non-conformal layer on a side wall of the trenches, and process chamber 510 may perform oxidation to form an oxide layer on the side wall of the trenches and to remove the non-conformal layer. The substrate 540 may be passed between the process chambers 506-516 by robot 532 under vacuum. Accordingly, no native oxide may grow on the substrate between the formation of trenches, the formation of a non-conformal layer on the trenches, and an oxide layer on the trenches in some embodiments.

The method of the present disclosure may be used to form tapered oxide layers in or on features having a high aspect ratio. For example, the high aspect ratio process may benefit from a thicker oxidation layer at the lower portion of the trenches. Thus, this may be achieved using the method as described above.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

The invention claimed is:

1. A method comprising:
 forming a non-conformal layer on at least one side wall of a trench or a hole formed on a substrate, wherein the non-conformal layer forms on an upper portion of the at least one side wall and decreases in thickness with increased depth into the trench or the hole, and wherein the non-conformal layer comprises nitrogen; and
 oxidizing the at least one side wall of the trench or the hole comprising the non-conformal layer, wherein oxidation of the non-conformal layer and an exposed portion of the at least one side wall not covered by the non-conformal layer occurs to form an oxide layer, wherein the oxide layer is thicker at a lower portion of the at least one side wall than the upper portion of the at least one side wall.

2. The method of claim 1, wherein the oxidizing comprises an initial oxidizing process having a first selectivity, and at least one additional oxidizing process having a second selectivity.

3. The method of claim 2, wherein the initial oxidizing process is performed to achieve a target taper for the oxide layer, and the at least one additional oxidizing process is performed to achieve a target thickness of the oxide layer.

4. The method of claim 2, wherein the initial oxidizing process is performed to achieve about 5% to about 50% of a thickness of the oxide layer.

5. The method of claim 1, wherein the forming the non-conformal layer is achieved through a chemical vapor deposition process, a thermal process or a radical plasma process.

6. The method of claim 1, wherein the forming the non-conformal layer comprising nitrogen is formed by performing nitridation of the substrate.

7. The method of claim 6, wherein the nitridation is achieved by applying nitrogen ($N_2$), ammonia ($NH_3$), hydrogen ($H_2$), argon (Ar), helium (He), or a combination thereof.

8. The method of claim 7, wherein the nitridation is performed at a pressure of about 0.5 T to about 500 T.

9. The method of claim 7, wherein the nitridation is performed at a temperature of about 250° C. to about 1250° C.

10. The method of claim 1, wherein the oxidizing is performed through thermal oxidation.

11. The method of claim 1, wherein the oxide layer comprises silicon dioxide.

12. The method of claim 1, wherein the non-conformal layer has a thickness of about 5 Å to about 50 Å at the upper portion of the at least one side wall.

13. The method of claim 1, wherein the non-conformal layer does not form on the lower portion of the least one side wall, resulting in the lower portion of the at least one side wall being the exposed portion of the at least one side wall.

14. The method of claim 1, wherein the non-conformal layer forms on about 25% of the at least one side wall.

15. The method of claim 1, wherein the oxidation is performed using an oxidizing agent comprising peroxide, steam ($H_2O$), or $H_2$:$O_2$, wherein $H_2$ and $O_2$ are in ratio of 5.5:1 to about 9:1.

16. The method of claim 1, wherein the substrate comprises silicon or silicon nitride.

* * * * *